US012628479B2

(12) United States Patent
Viklund

(10) Patent No.: US 12,628,479 B2
(45) Date of Patent: May 12, 2026

(54) CONTROLLED ANGLE EMISSIVE DISPLAY

(71) Applicant: Grant Viklund, Auburndale, MA (US)

(72) Inventor: Grant Viklund, Auburndale, MA (US)

( * ) Notice: Subject to any disclaimer, the term of this patent is extended or adjusted under 35 U.S.C. 154(b) by 441 days.

(21) Appl. No.: 18/240,306

(22) Filed: Aug. 30, 2023

(65) Prior Publication Data

US 2024/0072221 A1     Feb. 29, 2024

Related U.S. Application Data

(60) Provisional application No. 63/402,907, filed on Aug. 31, 2022.

(51) Int. Cl.
H10K 59/121     (2023.01)
H10H 20/855     (2025.01)

(52) U.S. Cl.
CPC ......... H10H 20/855 (2025.01); H10K 59/121 (2023.02)

(58) Field of Classification Search
None
See application file for complete search history.

*Primary Examiner* — Donald L Raleigh

(57)     ABSTRACT

A controlled angle emissive display apparatus includes a planar base structure, and a plurality of array columns coupled to the planar base structure, each array column comprising having an array base having two or more angled sides, and an emissive element secured to at least one of the angled sides of the array base, wherein the plurality of array columns is arranged upon the planar base structure in a repeating pattern.

20 Claims, 9 Drawing Sheets

FIG. 3A                       FIG. 3B
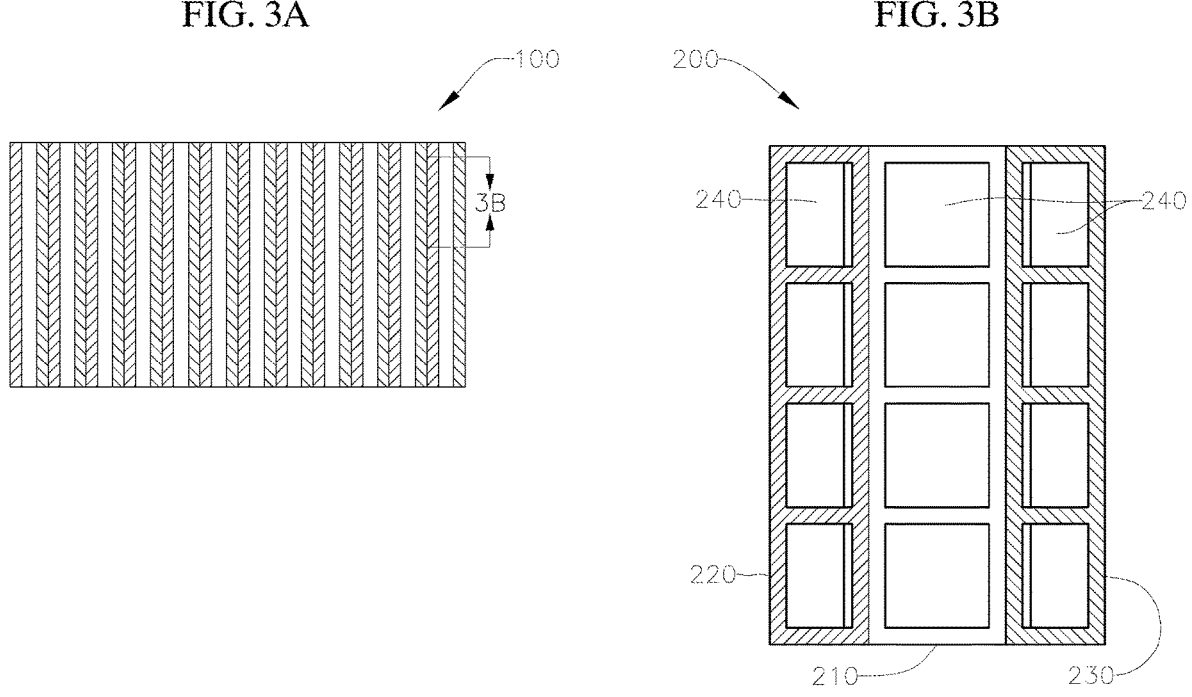

FIG. 5A
FIG. 5B
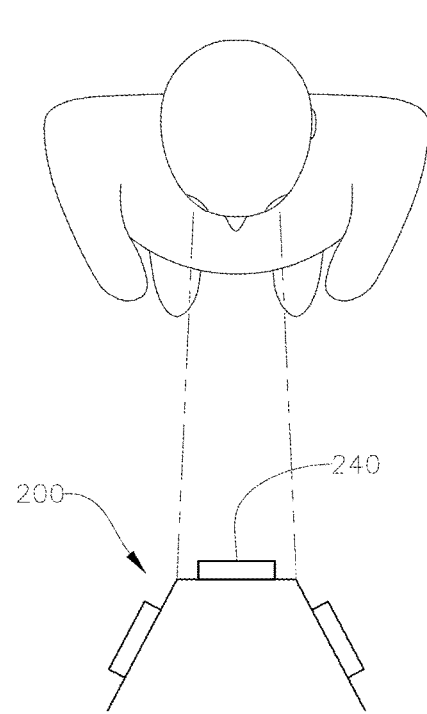
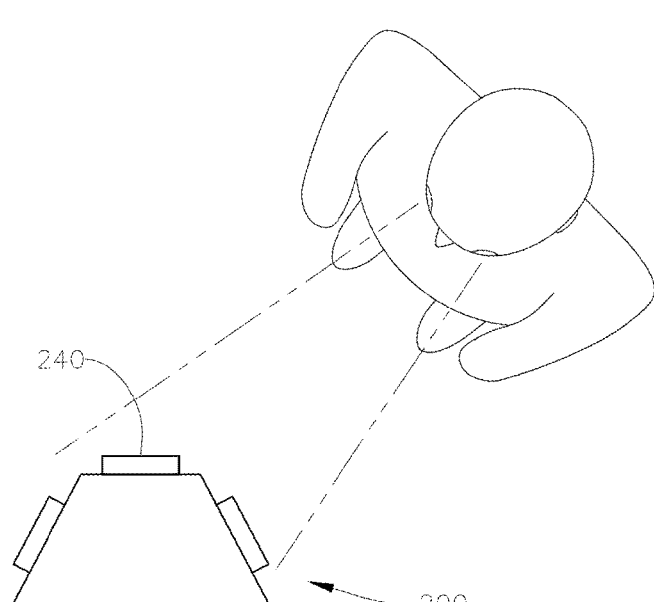

CONTROLLED ANGLE EMISSIVE DISPLAY

CROSS REFERENCE TO RELATED APPLICATION

This application claims the benefit of U.S. Provisional Application Ser. No. 63/402,907, filed Aug. 31, 2022, the entirety of which is incorporated by reference herein.

BACKGROUND OF THE INVENTION

Technical Field

Aspects of embodiments of the present disclosure relate to the field of emissive displays. More specifically, aspects of embodiments of the present disclosure are directed to electronic displays having angled arrays of emissive elements configured to enable lenticular-like images based on viewing angle such as with stereoscopic images.

Problems that are to be Solved by the Invention

Currently available emissive displays typically rely on lenticular lenses, LCD-based parallax barriers, or specialized eyewear to produce controlled angle display and/or stereoscopic display of an image. However, these technologies often have limited viewing angles/distances, unwanted visual defects, and reduced clarity in the projected image at non-optimal viewing angles, and inconvenient use requirements, such as battery powered eyewear, that diminish their utility for consumers. Therefore, there is a need for a controlled angle emissive display that can produce the display of distinct images at different viewing angles, i.e., controlled-angle display, and/or stereoscopic images for a viewer that provides clearer images at a broader range of viewing angles without the need for specialized eyewear. In many circumstances, the use of specialized eyewear to produce controlled-angle display or stereoscopic display of an image is impractical and limits the availability of such displays to a broad range of consumers and applications. This may be especially true for specialized eyewear that requires charging or battery power in order to operate, as this adds additional cost and inconvenience to the use of such displays.

Means for Solving the Problem

Aspects of embodiments of the present disclosure are directed to controlled angle emissive displays having one or more angular arrays of emissive elements. In some embodiments, the angular arrays of emissive elements may be arranged to facilitate controlled-angle display of an image, e.g., the selectable viewing angle, or stereoscopic display of an image. Such embodiments may provide increased viewing angles and clarity for the controlled angle display of an image without requiring the use of lenticular lenses or specialized eyewear for a user.

Effect of the Invention

Some embodiments of controlled angle emissive displays according to aspects of the present disclosure may provide increased utility and functionality for controlled angle display of an image or video by reducing the limitations of currently available controlled angle displays while also increasing the visual clarity of the controlled angle display at less restricted viewing angles and without requiring the use of specialized eyewear or other devices.

Some other embodiments of controlled angle emissive displays according to aspects of the present disclosure may also reduce light pollution in urban environments by focusing lights, signs and displays down to the viewers on the street and not up into the buildings above. Similarly, such embodiments may also facilitate controlled angle emissive display presentation of traffic signage, such as traffic lights and pedestrian crossing signs, that are visible only from the targeted traffic lane or walkway.

SUMMARY OF THE INVENTION

One or more embodiments of the present disclosure may be directed to a controlled angle emissive display.

A controlled angle emissive display apparatus includes a planar base structure, and a plurality of array columns coupled to the planar base structure, each array column having an array base having two or more angled sides, and an emissive element secured to at least one of the angled sides of the array base, wherein the plurality of array columns is arranged upon the planar base structure in a repeating pattern.

The controlled angle emissive display apparatus may have the plurality of array columns arranged parallel to one another at regularly spaced intervals.

The controlled angle emissive display apparatus may have the array base having three adjoined angled sides.

The controlled angle emissive display apparatus may have the three adjoined angled sides be configured having an interior angle of 120° formed between any two of the three adjoined angled sides.

The controlled angle emissive display apparatus may have the array base having five adjoined angled sides arranged having a central angled side adjoined to pairs of angled sides along orthogonal axes about the central angled side.

The controlled angle emissive display apparatus may have the five adjoined angled sides configured having an interior angle of 120° formed between the central angled side and each of the paired angled sides.

The controlled angle emissive display apparatus may have the emissive element include a light emitting diode (LED).

The controlled angle emissive display apparatus may have the emissive element include an organic light emitting diode (OLED) pixel unit.

A controlled angle emissive display array base apparatus includes a planar base structure, a first planar emissive surface having a first facing angle, a first emissive element, a first side, and a second side, a second planar emissive surface having a second emissive element and a second facing angle, and a third planar emissive surface having a third emissive element and a third facing angle, wherein the first planar emissive surface is coupled to the second planar emissive surface at the first side and the first planar emissive surface is coupled to the third planar emissive surface at the second side in a configuration having the first planar emissive surface displaced from the planar base structure.

The controlled angle emissive display array base apparatus may have the first facing angle of the first planar emissive surface be parallel to a normal axis defined by the planar base structure.

The controlled angle emissive display array base apparatus may have the first planar emissive surface further include a third side, and a fourth side.

The controlled angle emissive display array base apparatus may further include a fourth planar emissive surface having a fourth emissive element and a fourth facing angle, and a fifth planar emissive surface having a fifth emissive element and a fifth facing angle, wherein the first planar emissive surface is coupled to the fourth planar emissive surface at the third side and the first planar emissive surface is coupled to the fifth planar emissive surface at the fourth side.

The controlled angle emissive display array base apparatus may have the first emissive element, the second emissive element, and the third emissive element each include a light emitting diode (LED).

The controlled angle emissive display array base apparatus may have the first emissive element, the second emissive element, and the third emissive element each include an organic light emitting diode (OLED) pixel unit.

The controlled angle emissive display array base apparatus may have the first emissive element, the second emissive element, and the third emissive element each include a MicroLED unit.

The controlled angle emissive display array base apparatus may have the first emissive element, the second emissive element, and the third emissive element each include a lenticular lens unit.

The controlled angle emissive display array base apparatus may have the first emissive element, the second emissive element, and the third emissive element be configured to be independently addressed by one or more control circuits.

A 3-angle controlled angle emissive display apparatus includes a planar base structure defining a rectangular surface having a normal axis projecting perpendicular to the rectangular surface, a plurality of array columns arranged in a repeating pattern across the rectangular surface of the planar base structure, each of the array columns having one or more 3-sided array base units having an addressable emissive element for each of the 3 sides, and an addressable control circuit configured to operably couple to each addressable emissive element of the one or more 3-sided array base units.

The 3-angle controlled angle emissive display apparatus of claim 18 may have each 3-sided array base unit be configured to have a first side projecting a first viewing angle along a direction parallel to the normal axis projecting perpendicular to the rectangular surface of the planar base structure.

The 3-angle controlled angle emissive display apparatus may have each of the addressable emissive elements include a light emitting diode (LED).

BRIEF DESCRIPTION

The features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

FIG. 3A is a frontal view of an embodiment of a controlled angle emissive display, according to some aspects of the present disclosure;

FIG. 3B is a frontal view of an embodiment of a 3-angle array base, according to some aspects of the present disclosure;

FIG. 5A is a top-down view of a user viewing an embodiment of a 3-angle array base at a straight-on viewing angle, according to some aspects of the present disclosure;

FIG. 5B is a top-down view of a user viewing an embodiment of a 3-angle array base at an oblique viewing angle, according to some aspects of the present disclosure;

DETAILED DESCRIPTION

Figure 1:
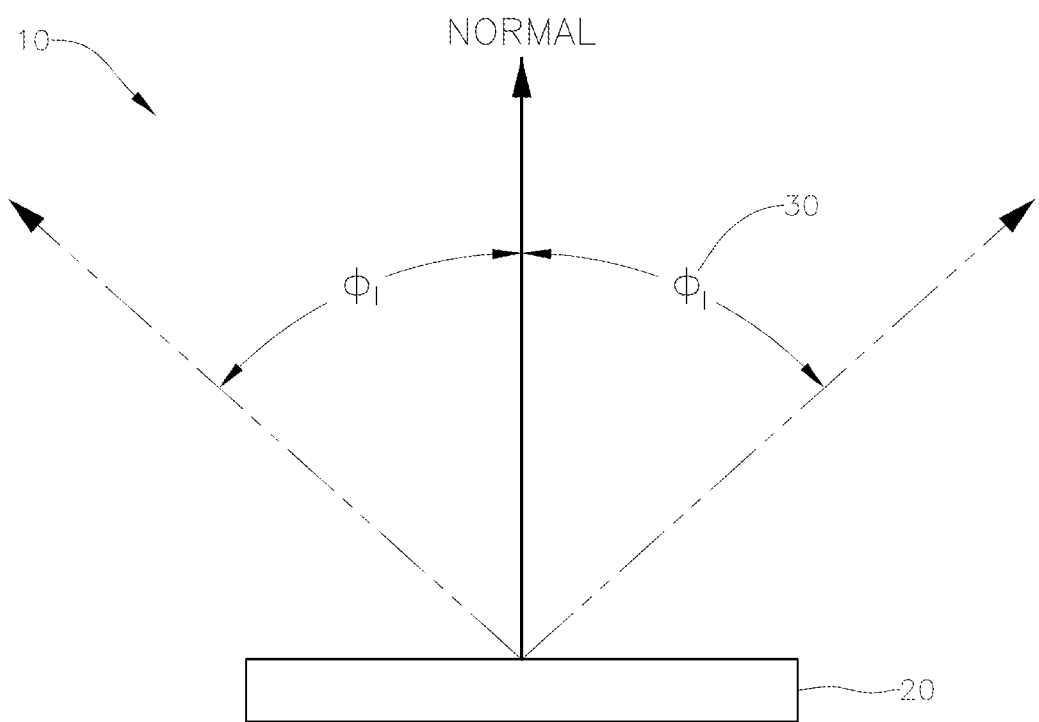
FIG. 1 is a simplified diagram of a display environment depicting various angles projecting from the display, according to some aspects of the present disclosure.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer, or section. Thus, a first element, component, region, layer, or section described below could be termed a second element, component, region, layer, or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined below, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Definitions

Controlled Angle Emissive Display: a display device configured to project one or more images along two or more angles using emissive light sources.

Controlled-angle Display: the selectable display of distinct images along different viewing angles.

3-angle: embodiments of an array base that include three (3) planar sides that may each be configured to couple to an emissive light source.

5-angle: embodiments of an array base that include five (5) planar sides that may each be configured to couple to an emissive light source.

Emissive Light Source: any light source configured to emit its own light.

Control Circuit: any combination of controllers, scan, drivers, processing units, power supplies, or other electronic devices and wires or conductive traces that may be communicably linked to one or more pixel units and be operated to selectively control said connected pixel units.

Lenticular Display: a display capable of projecting different images at distinct viewing angles simultaneously.

Stereoscopic Display: a display configured to project different images to each eye of a viewer thereby producing a stereoscopic effect.

MicroLED: a type of emissive light source having microscopic arrays of LEDs or other emissive light sources.

Pixel Unit: an emissive light source having one or more emissive elements that may be used to selectively emit light.

Facing Angle: the angle that an image is projected outward from the plane of a display relative to the normal axis projecting orthogonally outward from the plane of the display.

Interior Angle: the angle formed within an array base between two adjacent planar sides.

Viewing Angle: the angle at which a viewer is facing a display relative to the normal axis projecting orthogonally outward from the plane of the display.

One or more embodiments according to the present disclosure will now be described.

I. Controlled Angle Emissive Display Device

To help illustrate the terminology used herein to describe some embodiments of controlled angle emissive displays according to aspects of the present disclosure, FIG. 1 shows a simplified diagram of a display environment 10 depicting various angles, normal axis and facing angles 30, projecting from a display 20, according to some aspects of the present disclosure. The display 20 may be a controlled angle emissive display according to some aspects of the present disclosure. As shown, the normal axis projects outward orthogonally from the plane of the display 20. Light emitted by the display 20 along other angles, facing angles 30, may be describing according to the angular displacement of the facing angles 30 relative to the normal axis.

Figure 2:
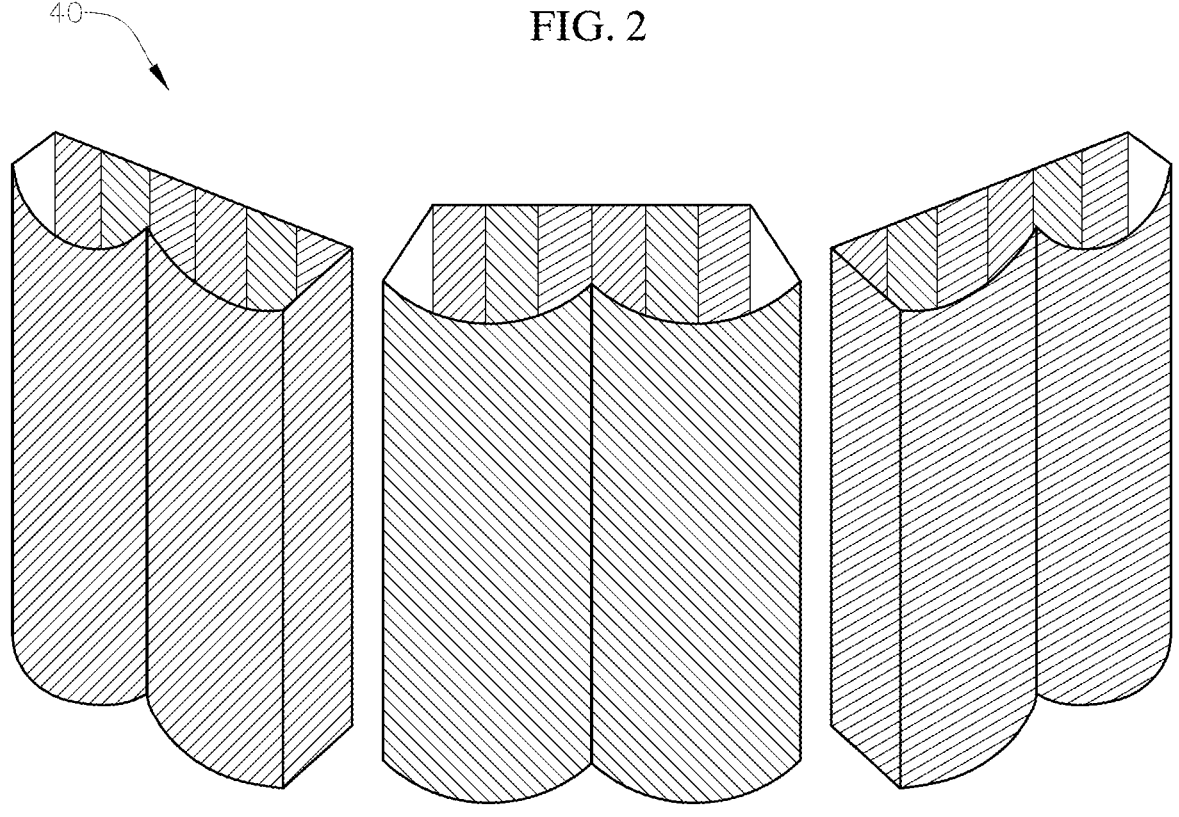
FIG. 2 is a perspective view of a lenticular lens at different orientations, according to some aspects of the present disclosure.

FIG. 2 is a perspective view of a lenticular lens at different orientations, according to some aspects of the present disclosure. As shown, prior systems for lenticular display used one or more lenses to project different images along different angular paths outward the lenticular lens. This type of controlled-angle display may, in some embodiments, be produced by controlled angle emissive displays of the present disclosure without the need for traditional lenticular lenses.

One or more embodiments of the present disclosure will now be described. As described previously, currently available technologies for producing controlled angle displays, for applications such as the lenticular display or stereoscopic display of images, often rely on lenticular lenses, or require specialized eyewear for a user. Aspects of embodiments of the present disclosure may be directed to controlled angle emissive displays having one or more angular arrays of emissive elements that may facilitate lenticular or stereoscopic display of an image without requiring lenticular lenses or specialized eyewear.

FIG. 3A is a frontal view of an embodiment of a controlled angle emissive display, according to some aspects of the present disclosure. As shown, in some embodiments, a controlled angle emissive display 100 of the present disclosure may have a display including one or more columns of array bases (alternatively referred to herein as "array columns") that form the angular arrays of emissive elements. Each of the structures that may, in some embodiments, be used within a controlled angle emissive display 100 of the present disclosure will be described in greater detail below.

A. Planar Base Structure

Figure 6:
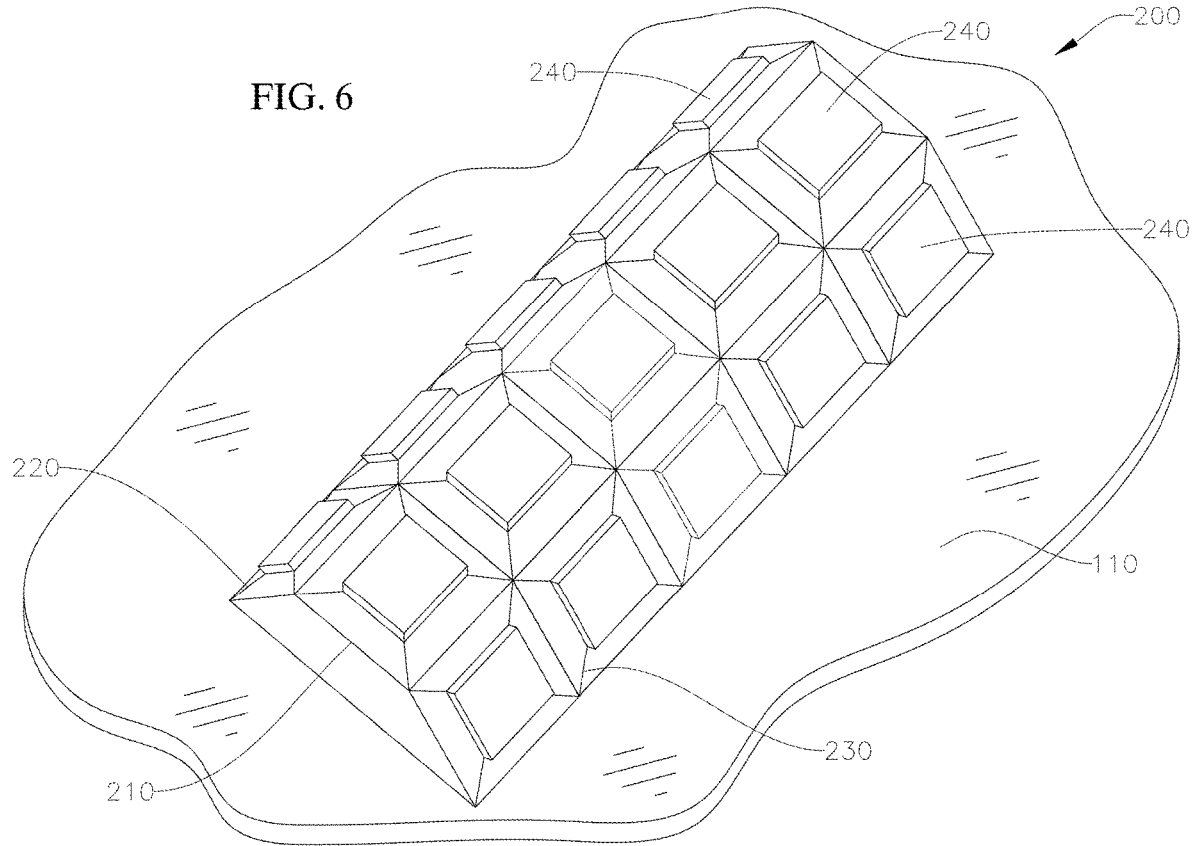
FIG. 6 is a perspective view of an embodiment of a 3-angle array base, according to some aspects of the present disclosure.

In some embodiments, a controlled angle emissive display 100 of the present disclosure may include a planar base structure 110 (as depicted in FIG. 6) that the other components of the controlled angle emissive display 100 may be coupled to or built upon. In some other embodiments, such as the embodiment depicted in FIG. 3A, the planar base structure 110 may define a rectangular display surface. However, as will be appreciated by one skilled in the art, the planar base structure 110 may, in some embodiments, define a display surface having other a square, rounded, ovoid, or other shape. Likewise, the dimensions of the planar base structure 110 may be varied to meet different use cases and needs. In some other embodiments, the planar base structure 110 may define a display surface that is not flat, i.e., a curved display surface, wherein the planar base structure 110 includes a plurality of sub-planes that may be configured to form a larger, curved structure. As a non-limiting example, the planar base structure 110 may, in some embodiments, form a cylindrical display surface or a spherical display surface. Such embodiments may produce a holographic-like display of an image/video or a domed/caved display of an image/video. In some other embodiments, the planar base structure 110 may be formed in a curved shape that has a continuous or nearly continuous curvature.

1. Construction & Materials

The planar base structure 110 may, in some embodiments, be constructed from any suitable material including, but not limited to, PCB, plastic resins, glass, silicon, ceramics, composites, polymers, metals, and other metal-like substrates. The planar base structure may be made with any number of manufacturing techniques as would be known to one skilled in the art, including but not limited to, welding, sintering, casting, injection molding, CNC, and additive manufacturing. As will be appreciated by one skilled in the art, the materials used and the dimensions, such as thickness, of the planar base structure 110 may be varied according to the needs of the display. As a non-limiting example, a larger display may, in some embodiments, require more components and thus be heavier than a smaller display. To account for the increased weight, the planar base structure 110 may be constructed from stronger materials or have increased thickness in order to provide a sufficiently strong structure for the other components.

B. Array Columns

As shown in FIG. 3A, some embodiments of a controlled angle emissive display 100 of the present disclosure may include columns of array bases that form arrays of angled emissive elements. The portion of the controlled angle emissive display 100 denoted as 3B is shown in more detail in FIG. 3B. FIG. 3B is a frontal view of an embodiment of a 3-angle array base 200, according to some aspects of the present disclosure. These structures, in some embodiments, may be arranged in a pattern across the display surface formed by the planar base structure 110. As a non-limiting example, the 3-angle array bases 200 may, in some embodiments, be arranged in a regular repeating pattern, such as columns as shown in FIG. 3A, to form a controlled angle emissive display 100 according to some aspects of the present disclosure. In some other embodiments, other array bases such as a 5-angle array base (300 of FIG. 7) may be used and arranged to form columns or other repeating array structures. As will be appreciated by one skilled in the art, the arrangement, spacing, and sizing of the array structures may be varied to meet different display needs. The array bases themselves, and the various embodiments thereof, will be described in more detail in a later section.

In some embodiments, when the array bases, such as the 3-angle array bases 200 of FIG. 3B, are arranged in repeating columns as shown in FIG. 3A the different planar surfaces of the columns may be co-aligned such that each set of similarly angled planar surfaces has a common facing angle. As a non-limiting example, in FIGS. 3A and 3B, there are 3 distinct facing angles (left, forward, and right). In some such embodiments, a controlled angle emissive display 100 of the present disclosure may be able to produce controlled-angle display of one or more images by projecting different images along each of the different facing angles. In some other embodiments, a stereoscopic display may be created by projecting different images along the different facing angles such that different images are presented to each eye of the viewer. This type of display operation may be further understood by reference to FIGS. 4A and 4B.

Figure 4A:
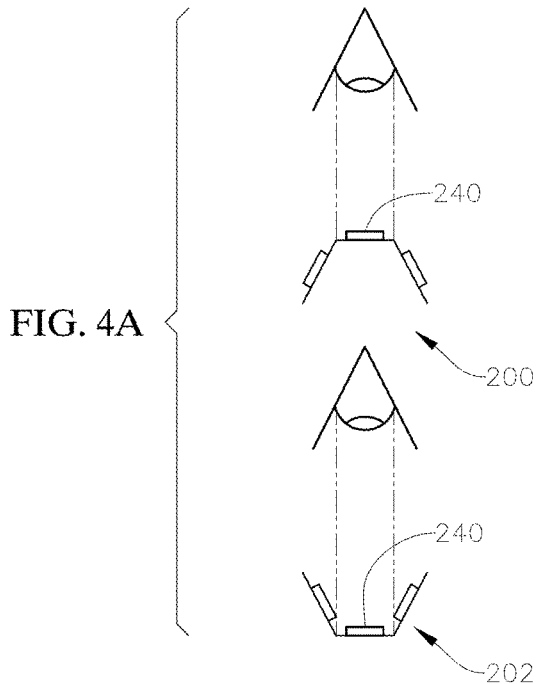
FIG. 4A is a top-down diagram depicting a viewing angle of a user facing different embodiments of a 3-sided array base, according to some aspects of the present disclosure.

FIG. 4A is a top-down diagram depicting a viewing angle of a user facing an embodiment of a 3-angle array base 200 in a convex configuration (upper) and a 3-angle array base 202 having a concave configuration (lower), according to some aspects of the present disclosure. As shown in the diagram, a viewer may, in some embodiments, be positioned relative to an array base, here 3-angle array bases 200 and 202 (convex and concave, respectively), such that only one planar side of the array base is directed towards the viewer's eye. This may be the case for both convex array bases (such as 3-angle array base 200) and concave array bases (such as concave 3-angle array base 202). The emissive elements, such as pixel units 240, projecting light to the viewer may thus, in some embodiments, be influenced by the geometry of the array bases used. This is elaborated on in FIG. 4B.

Figure 4B:
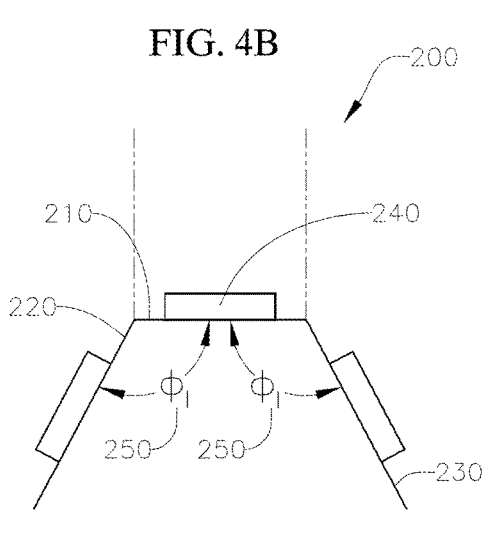
FIG. 4B is a top-down view of an embodiment of a 3-angle array base according to some aspects of the present disclosure.

FIG. 4B is a top-down view of an embodiment of a 3-angle array base 200 according to some aspects of the present disclosure. The 3-angle array base 200, as shown may have three planar sides, a first planar side 210, a second planar side 220, and a third planar side 230. Each of the planar sides may, in some embodiments, be configured with one or more pixel units 240. The facing angles of the second planar side 220 and the third planar side 230 may, in some embodiments, be set according to the interior angles 250 formed within the 3-angle array base 200. The interior angles 250 may, in some embodiments, be equal or substantially equal to facilitate uniform facing angles for all of the array bases. However, as will be appreciated by one skilled in the art, the scope of the present disclosure is not limited to only embodiments where the interior angles 250 are equal. As a non-limiting example, for embodiments having a curved display surface, the interior angles may be different between the left interior angle 250 and the right interior angle 250, and these differences may vary according to the curvature of the display surface at the location of the 3-angle array base 200.

The light emitted from a pixel unit 240, shown here with dotted lines, is thus projected substantially along a path determined by the geometry of the array base. As described above, this may, in some embodiments, like those shown in FIG. 4A, allow for the projection of light to the eye of a viewer along a specific facing angle. The functionality described herein may be further understood by reference to FIGS. 5A and 5B that depict the viewing angle of a user viewing a 3-angle array base 200.

FIG. 5A is a top-down view of a user viewing an embodiment of a 3-angle array base at a straight-on viewing angle, according to some aspects of the present disclosure. As shown, the viewer is only being shown light projected from a single planar side (210). Thus, in such an embodiment, the user is not located in a position to observe light being emitted from the second planar side or the third planar side of the 3-angle array base 200.

FIG. 5B is a top-down view of a user viewing an embodiment of a 3-angle array base at an oblique viewing angle, according to some aspects of the present disclosure. Here, the viewer may be out of the range of viewing angles that permit the viewer to see the pixel unit 240 that was being viewed in FIG. 5A. As the viewer is displaced further to the side, the viewer will move from observing the light emitted by the pixel unit 240 of the first planar side (210 of FIG. 4B) to the light emitted by the pixel unit or emissive light source of the third planar side (230 of FIG. 4B).

Further description of the array bases and the operation of the controlled angle emissive display 100 of the present disclosure to produce lenticular and stereoscopic displays will be provided below.

1. Array Bases & Array Base Units

FIG. 6 is a perspective view of an embodiment of a 3-angle array base, according to some aspects of the present disclosure. As shown, in some embodiments, the 3-angle array base 200 may be coupled to the planar base structure 110. When the 3-angle array base 200 projects outward from the planar base structure 110, such embodiments may be referred to as having convex array bases. Alternative embodiments, where the array bases project into the planar base structure 110, may be referred to as having concave embodiments. Each planar side of the 3-angle array base 200, first planar side 210, second planar side 220, and third planar side 230, may, in some embodiments, each have a corresponding pixel unit 240. In some embodiments, as depicted here, the 3-angle array base may be structured as a column of array base units that make up one or more rows of pixel units 240 within the 3-angle array base 200.

Figure 7:
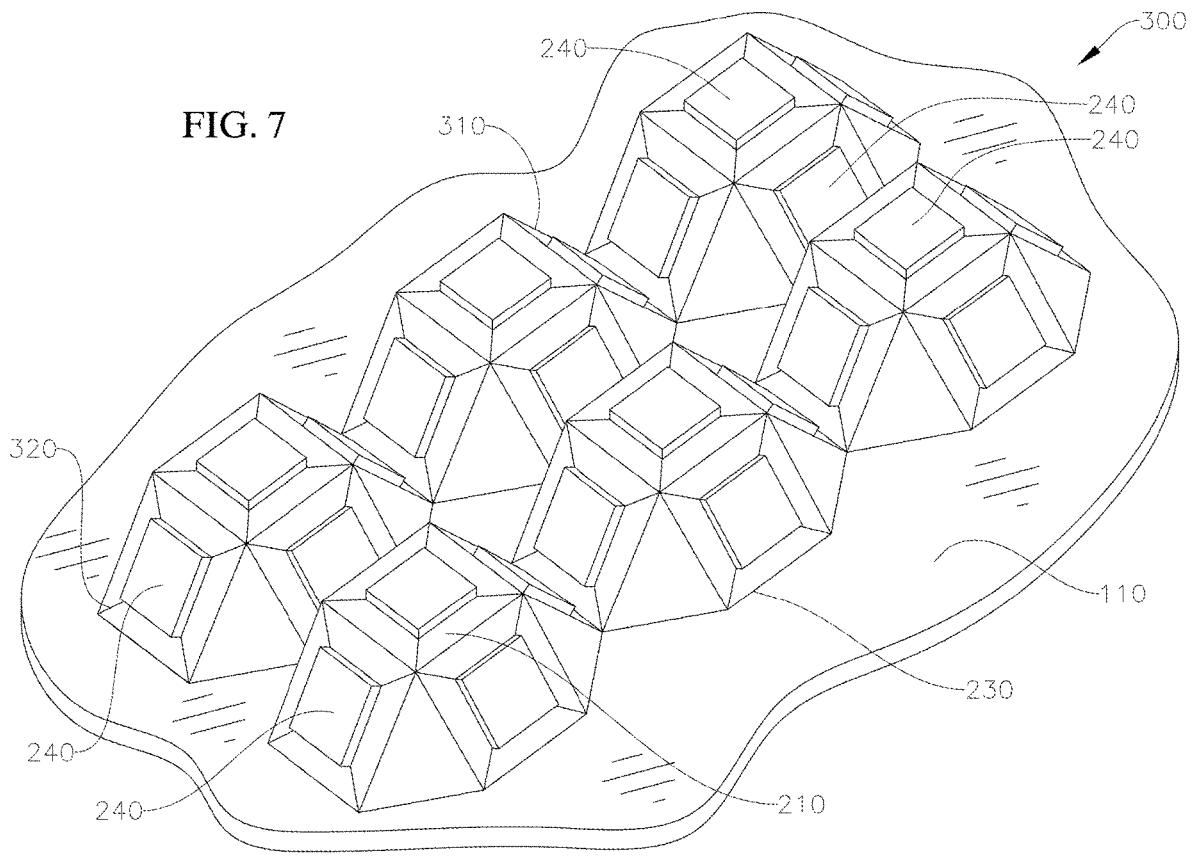
FIG. 7 is a perspective view of a plurality of embodiments of 5-angle array bases, according to some aspects of the present disclosure.

FIG. 7 is a perspective view of a plurality of embodiments of 5-angle array bases 300, according to some aspects of the present disclosure. As shown, in some embodiments, the 5-angle array bases 300 may have a first planar side 210, a second planar side 220, a third planar side 230, a fourth planar side 310, and a fifth planar side 320. In some embodiments, as shown, each planar side may have a corresponding pixel unit 240. Embodiments of the controlled angle emissive displays 100 of the present disclosure including 5-angle array bases 300 may, in some embodiments, have the 5-angle array bases 300 arranged in columns as shown. Similar considerations for the arrangement and geometry of the 5-angle array bases 300 are present as described above regarding the 3-angle array bases 200. The use of the 5-angle array bases 300 may, in some embodiments, provide additional facing angles that may be used to create additional or more complex lenticular or stereoscopic displays. Such embodiments may also allow for additional viewing angles to be utilized.

a. Planar Sides & Planar Emissive Surfaces

The planar sides of the array bases (210, 220, 230, 310, and 320), also referred to herein as angled sides or planar emissive surfaces, may be shaped and sized according to the needs of the display. In some embodiments, the planar sides may have a square or rectangular shape. However, the scope of the present disclosure is not limited to only these shapes. As a non-limiting example, the planar sides of the array bases may have the shape of any regular polygon. Moreover, in some other embodiments, the different planar sides may have different shapes. As a non-limiting example, the first planar side 210 may be a regular octagon while the remaining planar sides may be rectangular. As will be discussed in further detail different emissive light sources may be used as pixel units 240 within the controlled angle emissive displays 100 of the present disclosure, and the size of the planar sides may, in some embodiments, be base in part on the requirements of the pixel units 240. As a non-limiting example, in embodiments where each pixel unit includes only a single LED, the size of the planar sides may be sized accordingly. Alternatively, in embodiments where each pixel unit includes an array of OLED pixels or is a MicroLED array, the planar sides may be larger in size. The size of the second planar side 210 and the third planar side 230 may be different from the size of the first planar side 210. As a non-limiting example, in some embodiments, the length of the second planar side 220 and the third planar side 230 may be the length of the first planar side 210 multiplied by the square root of 2. Similar considerations are applicable for the 5-angle array bases 300 and any other array bases based upon their geometry as would be understood by one skilled in the art.

The angular orientation of the planar sides, as determined by the interior angles 250, may be varied according to the needs of the display. The ranges for the interior angles may range from 0° to 180° but, in some embodiments, may be determined by the number of planar sides used. As a non-limiting example, a 3-angle array base 200 may have interior angles of 120°. As will be understood by one skilled in the art, the interior angles in such embodiments may be determined mathematically, by looking at the interior angles of a polygon having twice the number of sides as the array base has planar sides in a row.

b. Construction & Materials

In some embodiments, the array bases may be formed of the same materials as used for the planar base structure 110. Likewise, similar construction methods may be used for constructing the array bases. As will be appreciated by one skilled in the art, any material known to one skilled in the art to be suitable for this purpose may be used within the scope of the present disclosure as may any suitable method of construction.

In some embodiments, the array bases may have an opening at the bottom that extends into an interior cavity. This may, in some embodiments, facilitate the connection of the pixel units 240 of the planar sides to power supplies and controls via wires or traces traversing the interior cavity (discussed in detail in Section (d)).

C. Emissive Elements

As defined above, emissive light sources (elements) may be any light source that can be operated to emit its own light. As a non-limiting example, emissive elements used within the scope of the present disclosure may be any suitable emissive light source known to one skilled in the art to be fit for this purpose. This may include, but is not limited to, LEDs, OLEDs, OLED arrays, MicroLEDs, plasma displays, CRT displays, lightbulbs, or any other emissive light source. In some embodiments, a single controllable emissive element or combination of elements may be coupled to a planar side of an array base. For such embodiments, the single controllable emissive element or combination of elements may be referred to as a pixel unit 240. In some embodiments, each pixel unit may be a single LED. In some other embodiments, each pixel unit 240 may include a combination of different colored LEDs that can be controlled to emit a specific color. In still other embodiments, each pixel unit 240 may be an OLED pixel array or a MicroLED array having a plurality of emitters that can be controlled to produce different patterns or colors. As a non-limiting example of such a pixel unit 240 is shown in FIG. 8.

Figure 8:
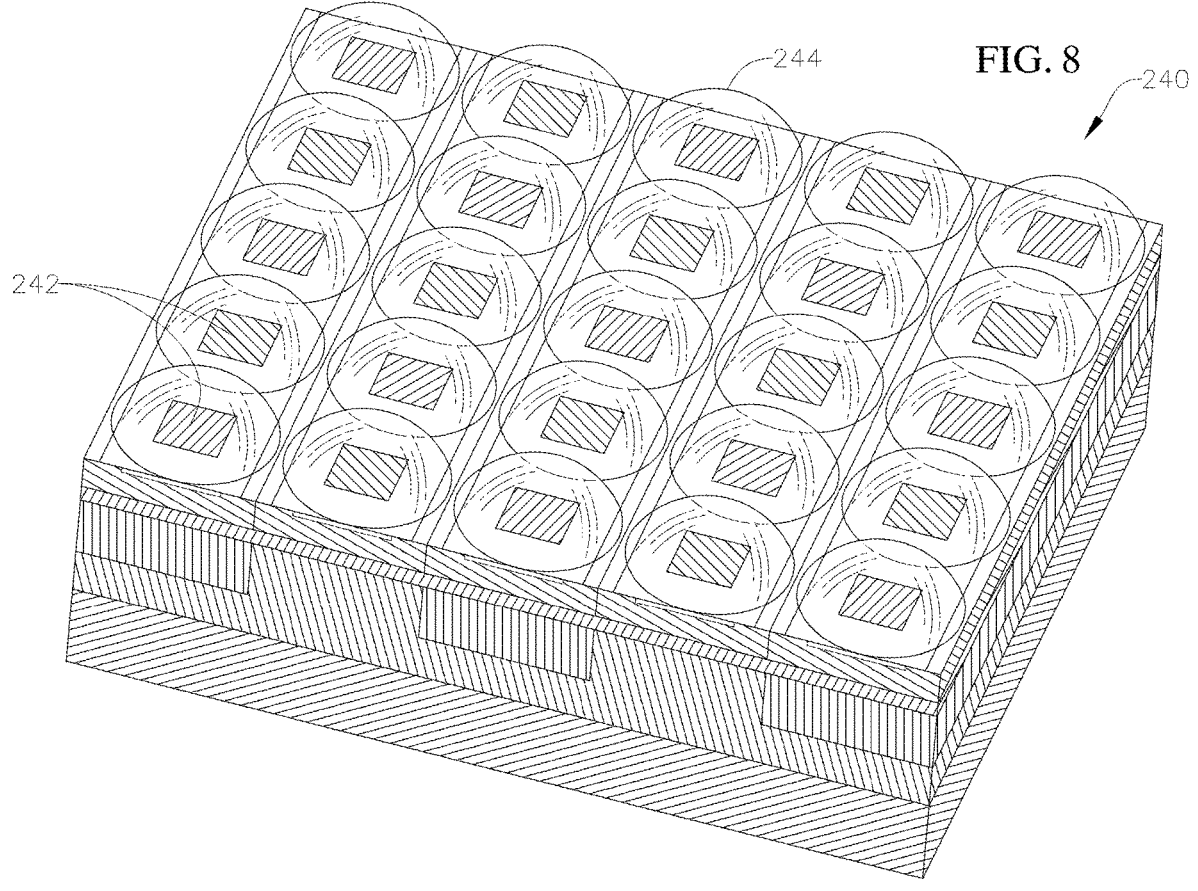
FIG. 8 is a perspective view of an embodiments of a pixel unit, according to some aspects of the present disclosure.

FIG. 8 is a perspective view of an embodiments of a pixel unit, according to some aspects of the present disclosure. As shown the pixel unit 240 may, in some embodiments, contain a plurality of emitters 242. As a non-limiting example, each of these may be a MicroLED emitter. In some other embodiments, a lenticular or focusing lens may be used. As shown, in some embodiments, each emitter 242 may have a corresponding lenticular lens 244. In some other embodiments, the lenticular or focusing lens 244 may be a single lens covering the full surface of the pixel unit 240. The use of such lenses may, in some embodiments, allow for finer control over the beam width of the light emitted from the pixel unit 240 and/or supplement the lenticular or stereoscopic display of light from each pixel unit 240.

D. Control Circuitry

The controlled angle display of embodiments of the present disclosure is facilitated by the independent control of the angled arrays of pixel units 240. In other words, for each set of pixel units 240 oriented at a specific facing angle common to the one or more array bases, the projection of lenticular images or stereoscopic images is produced by projecting different images to from the different sets of planar sides. As such, in some embodiments, a control circuit may be used to operate the pixel units 240 when the pixel units are arranged in an addressable matrix. Such a configuration is described further in FIG. 9.

Figure 9:
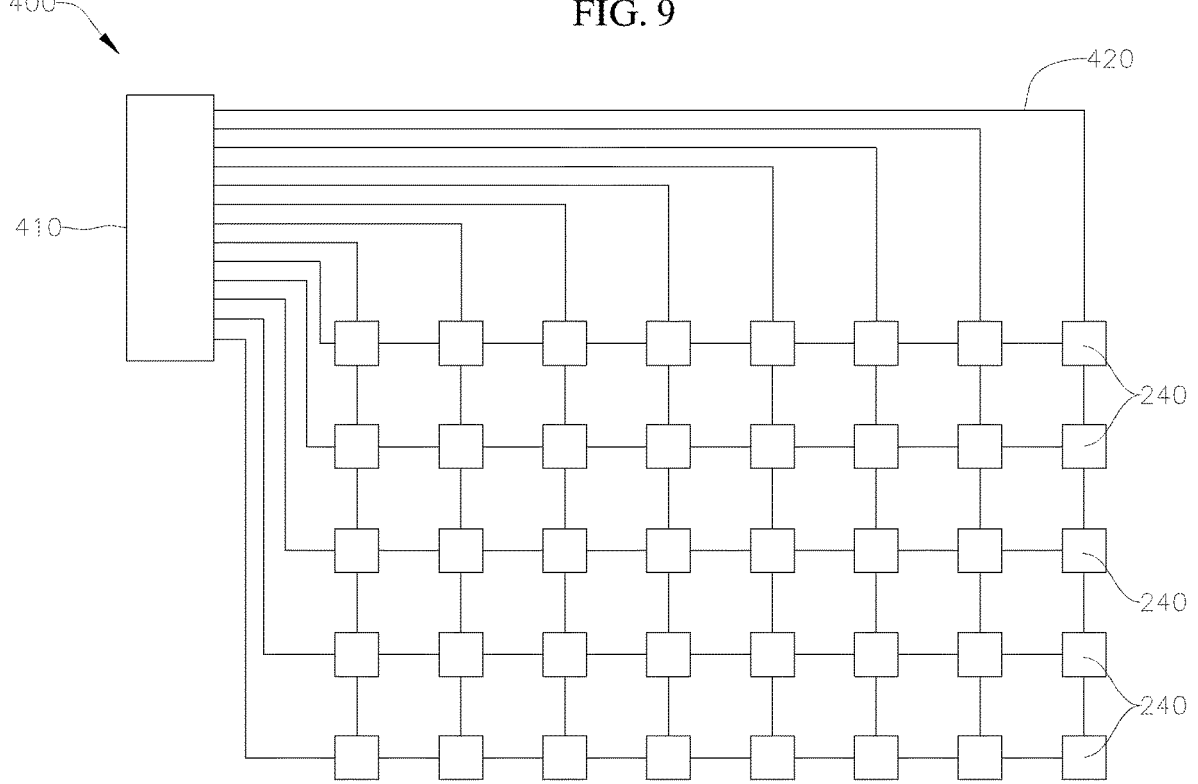
FIG. 9 is a simplified diagram of a control circuit for a matrix of emissive light sources, according to some aspects of the present disclosure.

FIG. 9 is a simplified diagram of a control circuit for a matrix of emissive light sources, according to some aspects of the present disclosure. As will be understood by one skilled in the art, many types of emissive displays use addressable matrices of emissive elements. As a non-limiting example of such a display would be an AMOLED display as are commonly found in mobile electronic devices. Here, as shown, the pixel units 240 of the controlled angle emissive display 100 of the present disclosure may, in some embodiments, be arranged as a matric of pixel units 240, i.e., emissive elements. The control circuit 400 may, in some embodiments, include one or more scan drivers, microcontrollers, power supplies, processing units, or other electronic devices (referred to herein as control devices 410) suitable for selectively operating the pixel units 240 as would be known to one skilled in the art. Control signals or voltages from the control device 410 may be directed to the matrix of pixel units along wires or conductive traces 420. As will be appreciated by one skilled in the art, the materials used for such traces, and the methods for constructing them, may be varied to meet different display needs. Any material and method of construction for the conductive traces 420 as would be known to one skilled in the art may be used within the scope of the present disclosure. However, because the controlled angle displays 100 of the present disclosure may, in some embodiments, include arrays of angled pixel units 240 based on their common angular orientation provided by the array bases, there will be patterns within the matrix of pixels that may be controlled as though they made up a single display. As a non-limiting example, for an embodiment with columns of 3-angle array bases 200, the control circuit 400 may be operated as though there are 3 distinct displays, corresponding to the first planar sides 210, the second planar sides 220, and the third planar sides 230. By independently controlling the images projected from each of the sets of planar sides, in some embodiments, the controlled angle displays 100 of the present disclosure may be able to produce lenticular and stereoscopic displays.

E. Additional Embodiments

As will be appreciated by one skilled in the art, the specifications of the controlled angle emissive displays 100 of the present disclosure may be varied to meet specific resolutions, color standards, or other functionalities found in other displays. As a non-limiting example, the resolution of a controlled angle emissive display 100 of the present disclosure may, in some embodiments, be set according to industry standards such as 1080p HD or 4K/8K UHD by varying the number and density of the pixel units 240 used within the display. Other functionality, such as gesture recognition or voice control, can be added in some embodiments, by incorporating the corresponding electronic devices such as microphones or forward-looking infrared cameras. Some non-limiting examples are described below.

Ultra-High-Definition (UHD) Video Display: A display that offers an exceptionally high pixel density, enabling the playback of 8K or even 16K video content.

Frameless Seamless Video Wall: A modular display system that seamlessly connects multiple controlled angle emissive displays 100 to create a video wall without visible borders, suitable for large-scale presentations and entertainment venues.

Dynamic Refresh Rate Display: A display with an adaptable refresh rate that automatically adjusts based on the content being displayed, ensuring smoother motion and reduced motion blur for videos.

Realistic Color Gamut Display: A display that covers a wide color gamut, such as Rec. 2020, enabling more accurate and vibrant color reproduction for a lifelike video experience.

High-Dynamic-Range (HDR) Display: A display that supports HDR technology, offering a broader range of brightness levels and contrast for more visually striking videos, particularly for scenes with varying lighting conditions.

Adaptive Aspect Ratio Display: A display that can dynamically adjust its aspect ratio to match the content being played, ensuring videos are displayed without black bars and utilizing the entire screen space.

Multi-View Autostereoscopic Display: A display that projects multiple views of the same scene, allowing viewers to perceive different angles with each eye, resulting in a glasses-free 3D experience.

3D Stereoscopic Video Display: A display that supports glasses-free 3D viewing, allowing users to enjoy 3D videos without the need for special eyewear, enhancing the sense of depth.

AI-Enhanced Upscaling Display: A display that uses artificial intelligence to upscale lower-resolution video content in real-time, improving the overall visual quality and clarity of older videos.

AI-Enhanced Stereoscopic Interpolation Display: A display that uses artificial intelligence and/or machine learning algorithms to interpolate a stereoscopic display from a monoscopic source image or to interpolate additional viewing angle images from a stereoscopic source image.

Nanoparticle-Based 3D Display: A display that utilizes nanoparticles to manipulate the way light is emitted or reflected from the screen, creating 3D visuals through controlled light interaction.

Integral Imaging Display: A display that employs an array of tiny lenses to capture and display different perspectives of an image, allowing viewers to see 3D content from various angles.

Energy-Efficient Micro LED Array: An array of Micro-LEDs that consume minimal energy while providing high brightness and contrast, suitable for wearable devices and low-power applications.

Parallax Barrier Display: A display that incorporates a parallax barrier layer to separate the left and right eye views, directing each image to the corresponding eye and creating a stereoscopic effect.

E-ink Display: displays having E-ink pixel units that can operate at low power consumptions and provide a paper-like viewing experience for a viewer.

Immersive Wraparound Screen: A display that curves around the edges of a device, providing a more immersive and panoramic viewing experience, particularly suitable for gaming and entertainment.

360-Degree Video Display: A display that provides an immersive experience for 360-degree videos, allowing users to explore the content by moving their device or using touch gestures.

Biometric Sensing Display: A display that incorporates biometric sensors to measure vital signs like heart rate and stress levels, enabling personalized content and interactions based on the user.

Multi-Sensory Display: A display that incorporates tactile feedback, scent generation, or even taste simulation, creating a more immersive and multi-sensory experience.

Gesture-Controlled Playback Display: A display with built-in gesture recognition technology that allows users to control video playback, volume, and other features through hand movements, enhancing interactivity.

Single-Angle Display: A display that has angled emitters on one side to control display from one angle and not another to offer increased privacy and controlled display direction.

It will be understood that embodiments described herein should be considered in a descriptive sense only and not for purposes of limitation. Descriptions of features or aspects within each exemplary embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claim. It should be noted that although examples of the invention are set forth herein, the claims, and the full scope of any equivalents, are what define the metes and bounds of the invention.

What is claimed is:

1. A controlled angle emissive display apparatus, comprising:
a planar base structure; and
a plurality of array columns coupled to the planar base structure, each array column comprising:
an array base having two or more angled sides; and
an emissive element secured to at least one of the angled sides of the array base;
wherein the plurality of array columns is arranged upon the planar base structure in a repeating pattern.

2. The controlled angle emissive display apparatus of claim 1, wherein the plurality of array columns are arranged parallel to one another at regularly spaced intervals.

3. The controlled angle emissive display apparatus of claim 1, wherein the array base has three adjoined angled sides.

4. The controlled angle emissive display apparatus of claim 3, wherein the three adjoined angled sides are configured having an interior angle of about 120° formed between any two of the three adjoined angled sides.

5. The controlled angle emissive display apparatus of claim 1, wherein the array base has five adjoined angled sides arranged having a central angled side adjoined to pairs of angled sides along orthogonal axes about the central angled side.

6. The controlled angle emissive display apparatus of claim 5, wherein the five adjoined angled sides are configured having an interior angle of about 120° formed between the central angled side and each of the paired angled sides.

7. The controlled angle emissive display apparatus of claim 1, wherein the emissive element comprises a light emitting diode (LED).

8. The controlled angle emissive display apparatus of claim 1, wherein the emissive element comprises an organic light emitting diode (OLED) pixel unit.

9. A controlled angle emissive display array base apparatus, comprising:
a planar base structure;
a first planar emissive surface comprising:
a first facing angle;
a first emissive element;
a first side; and
a second side;
a second planar emissive surface having a second emissive element and a second facing angle; and
a third planar emissive surface having a third emissive element and a third facing angle;
wherein the first planar emissive surface is coupled to the second planar emissive surface at the first side and the first planar emissive surface is coupled to the third planar emissive surface at the second side in a configuration having the first planar emissive surface displaced from the planar base structure.

10. The controlled angle emissive display array base apparatus of claim 9, wherein the first facing angle of the first planar emissive surface is parallel to a normal axis defined by the planar base structure.

11. The controlled angle emissive display array base apparatus of claim 9, wherein the first planar emissive surface further comprises:
a third side; and
a fourth side.

12. The controlled angle emissive display array base apparatus of claim 11, further comprising:
a fourth planar emissive surface having a fourth emissive element and a fourth facing angle; and a fifth planar emissive surface having a fifth emissive element and a fifth facing angle;

wherein the first planar emissive surface is coupled to the fourth planar emissive surface at the third side and the first planar emissive surface is coupled to the fifth planar emissive surface at the fourth side.

13. The controlled angle emissive display array base apparatus of claim 9, wherein the first emissive element, the second emissive element, and the third emissive element each comprise a light emitting diode (LED).

14. The controlled angle emissive display array base apparatus of claim 9, wherein the first emissive element, the second emissive element, and the third emissive element each comprise an organic light emitting diode (OLED) pixel unit.

15. The controlled angle emissive display array base apparatus of claim 9, wherein the first emissive element, the second emissive element, and the third emissive element each comprise a MicroLED unit.

16. The controlled angle emissive display array base apparatus of claim 9, wherein the first emissive element, the second emissive element, and the third emissive element each comprise a lenticular lens unit.

17. The controlled angle emissive display array base apparatus of claim 9, wherein the first emissive element, the second emissive element, and the third emissive element are configured to be independently addressed by one or more control circuits.

18. A 3-angle controlled angle emissive display apparatus, comprising:

a planar base structure defining a rectangular surface having a normal axis projecting perpendicular to the rectangular surface;

a plurality of array columns arranged in a repeating pattern across the rectangular surface of the planar base structure, each of the array columns comprising one or more 3-sided array base units having an addressable emissive element for each of the 3 sides; and an addressable control circuit configured to operably couple to each addressable emissive element of the one or more 3-sided array base units.

19. The 3-angle controlled angle emissive display apparatus of claim 18, wherein each 3-sided array base unit is configured to have a first side projecting a first viewing angle along a direction parallel to the normal axis projecting perpendicular to the rectangular surface of the planar base structure.

20. The 3-angle controlled angle emissive display apparatus of claim 18, wherein each of the addressable emissive elements comprise a light emitting diode (LED).

* * * * *